US008403543B2

(12) United States Patent
Kim et al.

(10) Patent No.: US 8,403,543 B2
(45) Date of Patent: Mar. 26, 2013

(54) LIGHTING MODULE AND LIGHTING APPARATUS COMPRISING THE SAME

(75) Inventors: Kwang Soo Kim, Seoul (KR); Sung Ho Hong, Seoul (KR); Young Ho Shin, Seoul (KR); Ki Man Park, Seoul (KR); Young Seok Yu, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/293,440

(22) Filed: Nov. 10, 2011

(65) Prior Publication Data

US 2012/0057357 A1 Mar. 8, 2012

(30) Foreign Application Priority Data

Nov. 24, 2010 (KR) ........................ 10-2010-0117191
Nov. 26, 2010 (KR) ........................ 10-2010-0118926
Nov. 26, 2010 (KR) ........................ 10-2010-0118927
Nov. 26, 2010 (KR) ........................ 10-2010-0118928
Nov. 26, 2010 (KR) ........................ 10-2010-0118929

(51) Int. Cl.
*H01L 33/00* (2010.01)
*H01L 31/12* (2006.01)

(52) U.S. Cl. ........................................ 362/373; 362/294

(58) Field of Classification Search .................. 362/294, 362/373, 19, 602
See application file for complete search history.

(56) References Cited

U.S. PATENT DOCUMENTS

2012/0092873 A1* 4/2012 Chang ........................... 362/294
2012/0106122 A1* 5/2012 Ryu et al. ........................ 362/19

* cited by examiner

*Primary Examiner* — Joseph L Williams
(74) *Attorney, Agent, or Firm* — KED & Associates, LLP

(57) ABSTRACT

A lighting module may be provided that includes a light emitting device module including at least one light emitting diode; and a heat sink radiating heat generated from the light emitting device module and including at least one partition wall formed on a base.

20 Claims, 10 Drawing Sheets

LIGHTING MODULE AND LIGHTING APPARATUS COMPRISING THE SAME

CROSS-REFERENCE TO RELATED APPLICATION

This application claims priority under 35 U.S.C. §119 from Korean Application No. 10-2010-0117191, filed on Nov. 24, 2010, Korean Application No. 10-2010-0118926, filed on Nov. 26, 2010, Korean Application No. 10-2010-0118927, filed on Nov. 26, 2010, Korean Application No. 10-2010-0118928, filed on Nov. 26, 2010, and Korean Application No. 10-2010-0118929, filed on Nov. 26, 2010, the subject matters of which are incorporated herein by reference.

BACKGROUND

1. Field

Embodiments may relate to a lighting module and a lighting apparatus comprising the same.

2. Background

In general, an electric bulb or a fluorescent lamp is commonly used as an indoor or outdoor lighting lamp. However, the electric bulb or the fluorescent lamp has a short life span, so that it should be frequently changed. Moreover, a conventional fluorescent lamp is degraded due to elapse of time for its use. As a result, it is often that its illuminance is gradually decreased.

In order to overcome such problems, various types of lighting apparatuses are now being developed by using a light emitting device (hereinafter, referred to as LED). The LED is easy to control and has a rapid response speed, high electro-optic conversion efficiency, a long life span, low power consumption and high luminance. The LED is also used to create emotional lighting.

Recently, efforts are being made to provide outdoors and use the lighting apparatus. Therefore, there is a necessity of an optimized design of a heat radiating configuration or a coupling configuration of the lighting apparatus, which is suitable to outdoors use the lighting apparatus.

SUMMARY

One embodiment is a lighting module. The lighting module includes: a light emitting device module including at least one light emitting diode; and a heat sink radiating heat generated from the light emitting device module and including at least one partition wall formed on a base.

At least one inclined surface at a predetermined angle may be formed on at least a portion of the top surface of the base.

A first opening portion may be formed at a predetermined point of the base. The at least one inclined surface may be inclined toward the opening portion.

The lighting module may further include a substrate disposed between the light emitting device module and the heat sink; and a cover in which the light emitting device module is disposed. At least two of the heat sink, the substrate and the cover may include a second opening portion corresponding to the first opening portion.

The lighting module may further include a waterproof body disposed between the light emitting device module and the substrate. The waterproof body may include a third opening portion corresponding to the first opening portion.

The at least one partition wall may be formed in a first direction parallel with the longitudinal direction of the base or in a second direction perpendicular to the first direction.

The lighting module may further include a cover accommodating the light emitting device module disposed therein and including a connector which is formed in one side of the cover and is connected to a power supplier for driving the light emitting device module.

The connector may include a depression allowing the terminal of the power supplier to be directly inserted into the connector.

The partition wall may be constituted by a plurality of poles having a polygonal cross section.

The lighting module may include: a cover accommodating the light emitting device module and including a first opening exposing a light emitting device disposed on one side of the light emitting device module; a waterproof body being disposed between the cover and the light emitting device module and including a second opening corresponding to the first opening of the cover; and a substrate being disposed on the other side of the light emitting device module and including wiring lines for driving the light emitting device.

Another embodiment is a lighting apparatus. The lighting apparatus includes: one or more lighting modules having the aforementioned features; and a frame in which the one or more lighting modules are disposed adjacent to each other.

The lighting apparatus may further include a pressing portion at one side of the frame, which supports one side of a lighting module disposed closest to the one side of the frame among the one or more lighting modules.

The lighting apparatus may further include a coupling member supporting between the lighting modules:

One side of the heat sink included in the lighting module may include a coupling recess into which the coupling member is inserted.

The one or more lighting modules may be disposed in some areas of the frame. A dummy area including no lighting module may be formed in the rest of the area of the frame.

A sub-frame covering at least a portion of the rest of the area of the frame may be disposed in the dummy area.

The one or more lighting modules may be sequentially arranged in a farther direction from the power supplier. The dummy area may be disposed as far as possible from the power supplier.

BRIEF DESCRIPTION OF THE DRAWINGS

Arrangements and embodiments may be described in detail with reference to the following drawings in which like reference numerals refer to like elements and wherein.

DETAILED DESCRIPTION

A thickness or a size of each layer may be magnified, omitted or schematically shown for the purpose of convenience and clearness of description. The size of each component may not necessarily mean its actual size.

It should be understood that when an element is referred to as being 'on' or "under" another element, it may be directly on/under the element, and/or one or more intervening elements may also be present. When an element is referred to as being 'on' or 'under', 'under the element' as well as 'on the element' may be included based on the element.

An embodiment may be described in detail with reference to the accompanying drawings.

First Embodiment

Figure 1A:
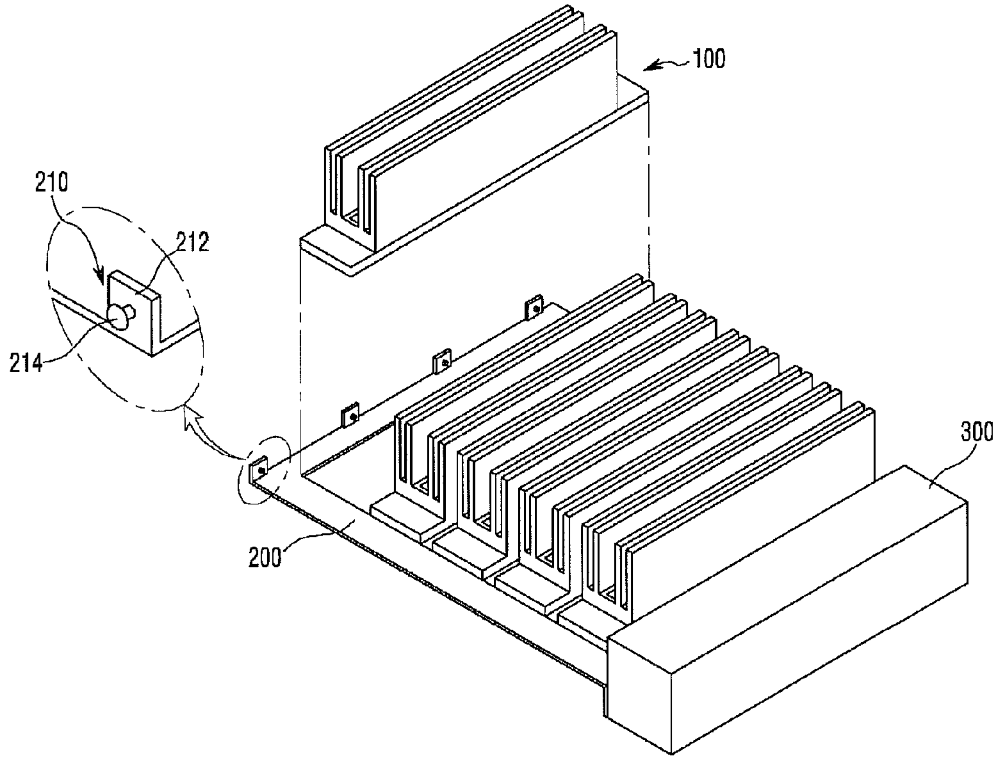
FIG. 1*a* is a plan perspective view showing a configuration of a lighting apparatus according to a first embodiment.
Figure 1B:
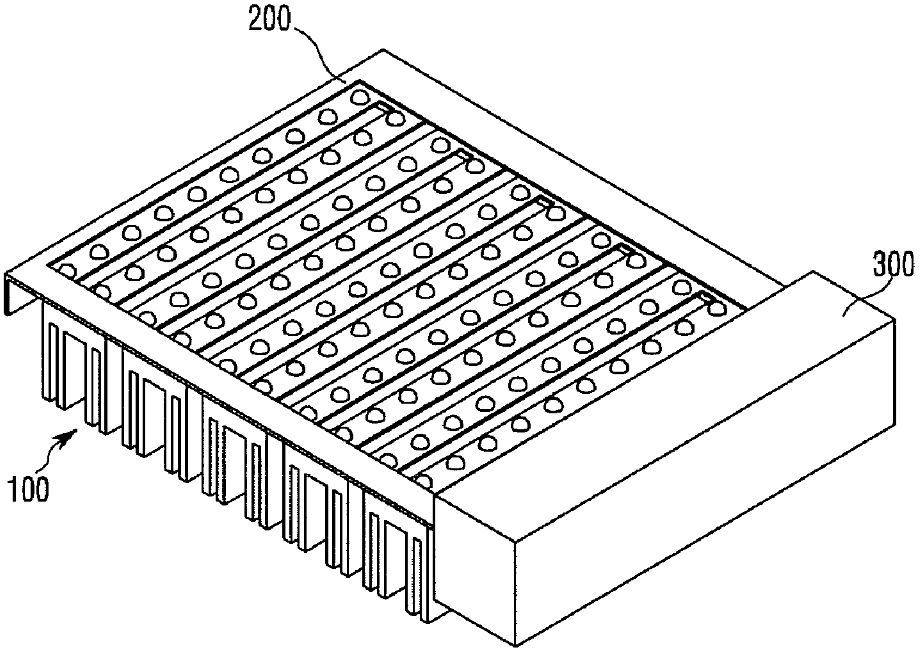
FIG. 1*b* is a bottom perspective view showing a configuration of the lighting apparatus according to the first embodiment.
Figure 2A:
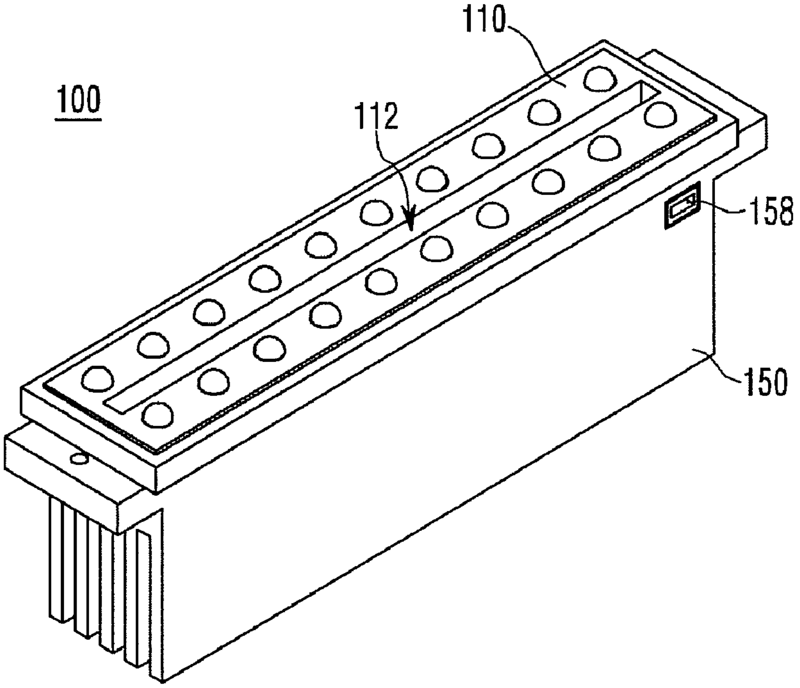
FIGS. 2*a* and 2*b* are bottom perspective views showing a configuration of a lighting module according to the first embodiment.
Figure 2B:
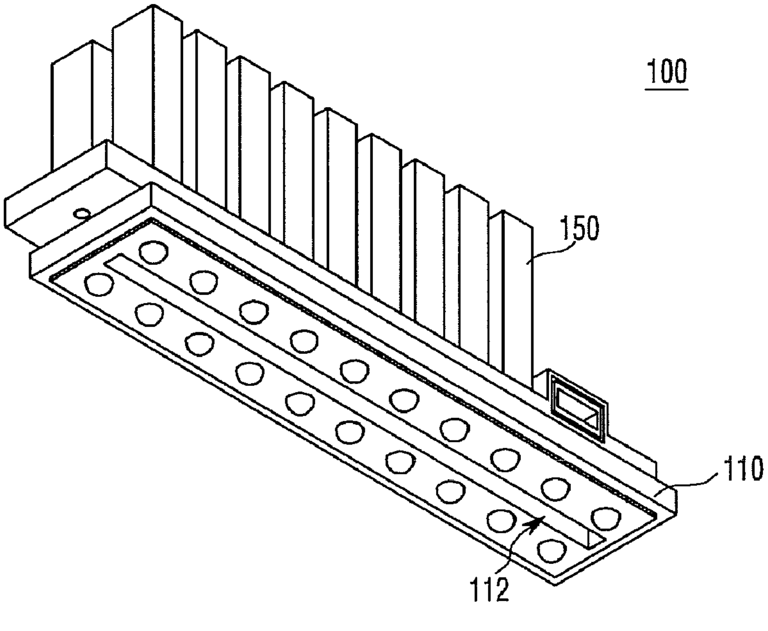
Figure 3A:
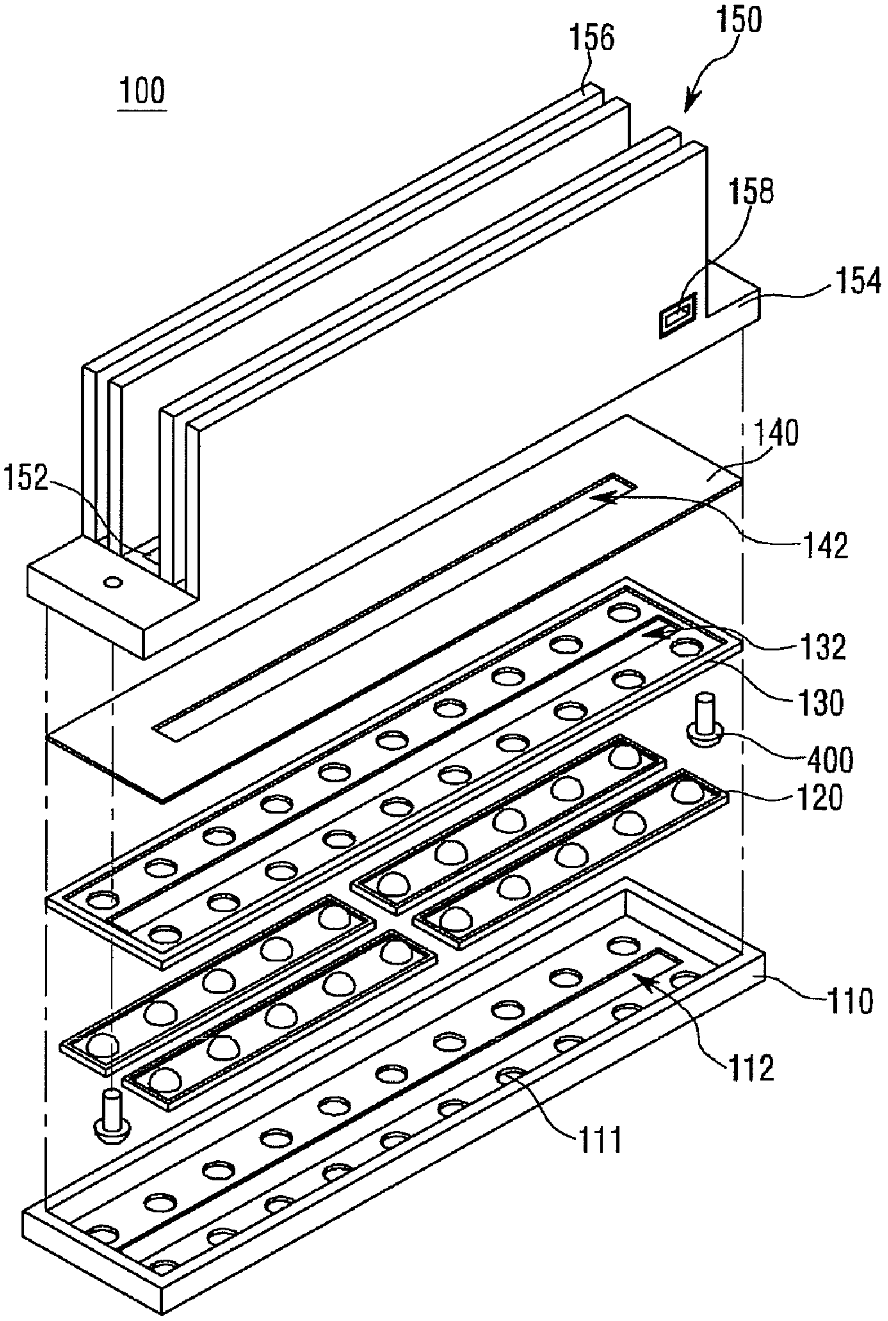
FIGS. 3*a* and 3*b* are exploded perspective views for describing in detail configurations of the lighting modules shown in FIGS. 2*a* and 2*b* respectively.
Figure 3B:
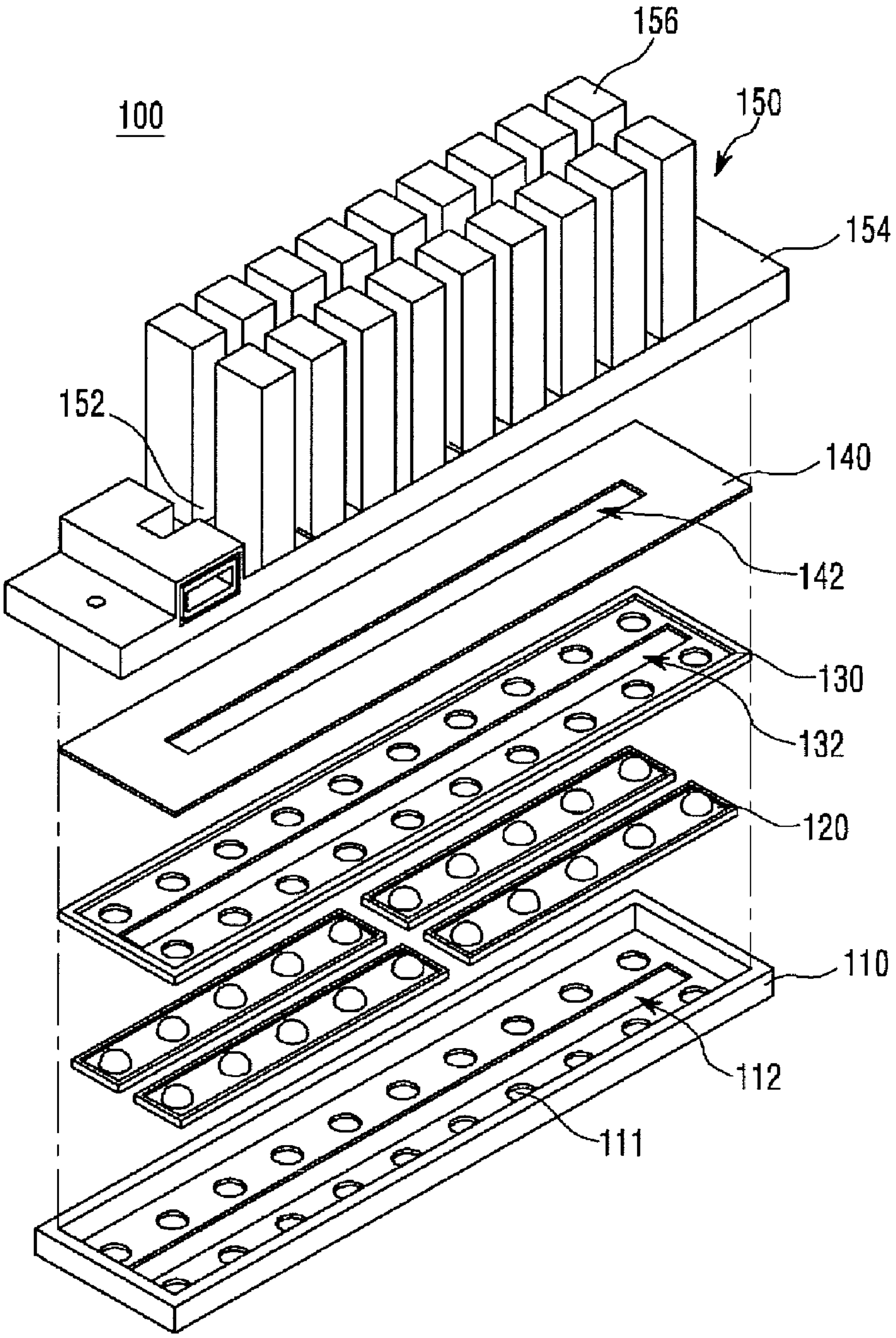
Figure 3C:
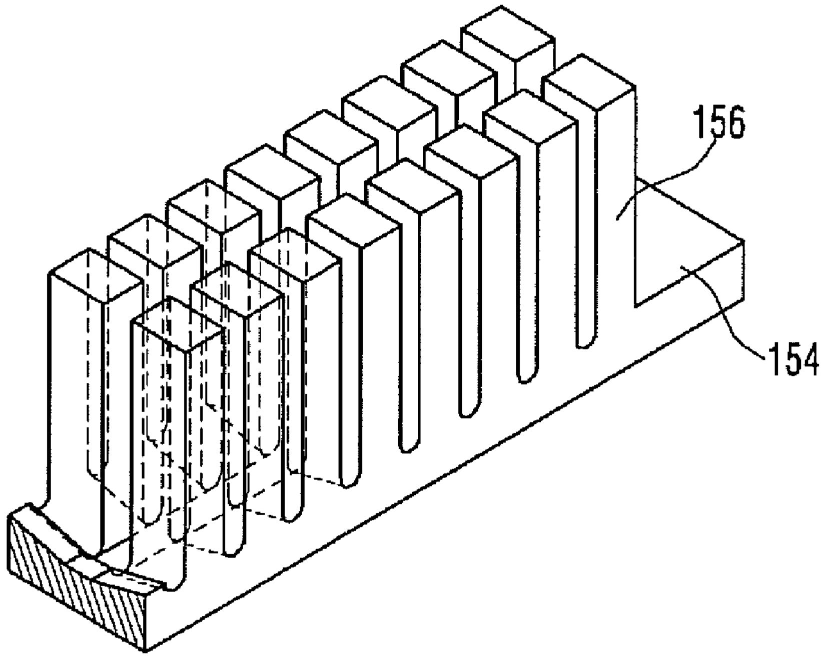
FIG. 3*c* is a perspective view showing a configuration of a heat sink included in the lighting module according to the embodiment.

FIGS. 1*a* and 1*b* are a plan perspective view and a bottom perspective view respectively which show a configuration of a lighting apparatus according to an embodiment. FIGS. 2*a* and 2*b* are bottom perspective views showing a configuration of a lighting module constituting the lighting apparatus according to the embodiment. FIGS. 3*a* and 3*b* are exploded perspective views for describing in detail configurations of the lighting modules shown in FIGS. 2*a* and 2*b* respectively. FIG. 3*c* is a perspective view showing a configuration of a heat sink of the lighting apparatus according to the embodiment.

The lighting apparatus according to the embodiment may be formed to include a lighting module 100, a frame 200 receiving the lighting module 100, and a power supplier 300 which is formed on one side of the frame 200 and supplies electric power to the lighting module 100. Although the drawings show that the power supplier 300 is formed adjacent to any one lighting module 100 of a plurality of the lighting modules, the power supplier 300 may be formed in another way. For example, the power supplier 300 may be formed on one side of the frame, which is perpendicular to the longitudinal direction of the lighting module 100 among the sides of the frame in such a manner as to be adjacent to all of the lighting modules 100. Also, the power supplier 300 may be formed outside the frame 200 and supply electric power through a cable and the like.

The frame 200 may receive at least one lighting module 100. The lighting modules 100 may be arranged separately from each other at a predetermined interval in parallel in the longitudinal direction thereof. For example, as shown in the drawings, the rectangular lighting modules 100 as viewed in the plan view may be arranged in parallel with each other at a predetermined interval in the longitudinal direction of the frame. The interval between the lighting modules 100 is able to perform the same function as that of an opening portion formed in the lighting module 100 itself. This will be described later. The frame 200 may be formed to have a standardized size. For example, the frame 200 may be formed in such a manner as to receive a certain number of the standardized lighting modules 100. While the drawings show the frame 200 capable of receiving five lighting modules 100 in all, it is also possible to form the frame 200 capable of receiving another number of the lighting modules 100.

The lighting module 100 received in the frame 200 may be formed to include a cover 110, a light emitting device module 120, a waterproof body 130, a substrate 140 and a heat sink 150.

The cover 110 covers and protects the light emitting device module 120. The cover 110 may include at least one opening 111 allowing a light source included in the light emitting device module 120 to be exposed outward when the cover 110 is coupled to the light emitting device module 120. The opening 111 may be formed corresponding to the shape of the light emitting device module 120 designed to be coupled to the cover 110 and the shape of the light source included in the light emitting device module 120. An opening portion 112 may be formed in the cover 110 according to the embodiment. The opening portion 112 is able to function as an air flow path when the lighting apparatus outdoors operates. The opening portion 112 may be formed in parallel with the longitudinal direction of the cover 110 and pass through the center of the cover 110, or may be formed at a different position and in a different direction. The cover 110 may be formed of a material having a heat radiating characteristic suitable for radiating heat from the light emitting device module 120.

The light emitting device module 120 may be formed to include at least one light emitting device. The light emitting device functions as a light source of the entire lighting module 100. While the drawings show a bar-type light emitting device module 120, the light emitting device modules 120 having different types may be included. The light emitting device included in the light emitting device module 120, that is, the light source is exposed outward through the opening 111 of the cover 110 and emits light. The light emitting device module 120 may be generally formed to be received in the cover 110 and it is recommended that the cover 110 should be formed not to cover the opening portion 112. The light emitting device included in the cover 110 may be a light emitting diode (LED) or may be other kinds of light emitting devices.

The waterproof body 130 formed to have a shape corresponding to the shapes of the cover 110 and the substrate 140 may be interposed. The waterproof body 130 may be formed for the purpose of waterproofing the entire lighting module 100 and light emitting device module 120. The waterproof body 130 may be formed of a material, for example, rubber, etc., which does not absorb moisture. The waterproof body 130 may be formed to have a shape corresponding to the shapes of the cover 110 and the substrate 140. In other words, the entire waterproof body 130 may be formed to have the same shape as the shapes of the cover 110 and the substrate 140 and to have an opening portion 132 which is formed at a position corresponding to those of the opening portions 112 and 142 of the cover 110 and the substrate 140 and has the same shape as the shapes of the opening portions 112 and 142.

The substrate 140 may be a printed circuit board (PCB) and the like. The substrate 140 may have wiring formed therein so as to drive the light emitting device included in the light emitting device module 120. As described above, the substrate 140 has a shape corresponding to those of the cover 110 and the waterproof body 130. That is, the substrate 140 also have an opening portion 142 which is formed at a position corresponding to those of the opening portions 112 and 132 of the cover 110 and the waterproof body 130 and has the same shape as the shapes of the opening portions 112 and 132.

The heat sink 150 functions to radiate heat generated from the entire lighting module 100 by the operation of the light emitting device module 120. The heat sink 150 may be formed to have the maximal surface area for the sake of heat radiation efficiency. For example, as shown in FIG. 3*a*, the heat sink 150 may be formed to include at least one partition wall 156, which is formed in parallel at a regular interval in the longitudinal direction of the heat sink 150, on a base 154 including an opening portion 152 formed therein corresponding to opening portions of the cover 110, the waterproof body 130 and the substrate 140. The at least one partition wall 156 may be constituted by a plurality of poles having a polygonal cross section.

Also, as shown in FIG. 3*b*, the heat sink 150 may be formed to include at least one partition wall 156, which is formed in parallel at a regular interval in a direction perpendicular to the longitudinal direction of the heat sink 150, on the base 154 including the opening portion 152 formed therein. The heat sink 150 may be formed of a material having an excellent heat radiating characteristic, for example, aluminum and the like.

As shown in FIG. 3*c*, the surface of the interval between the partition walls 156 may be formed obliquely at a certain angle perpendicularly to the longitudinal direction of the heat sink 150. For example, the surface of the interval may be oblique toward the opening portion 152. That is, the partition wall 156 may be formed on the base 154 including a surface inclined at a certain angle toward the opening portion 152. As shown in FIG. 3*c*, when the opening portion 152 is formed in the center of the base 154 in parallel with the longitudinal direction of the base 154, inclined surfaces may be formed on both sides of the opening portion 152. The inclined surface functions as a flow path of rainwater staying in the lighting module 100 when it rains. Therefore, the inclined surface allows the rainwater easily to flows out through the opening portion 152.

Meanwhile, when the cover 110, the waterproof body 130, the substrate 140 and the heat sink 150 do not include the opening portions 112, 132, 142 and 152, the base 154 of the heat sink 150 may be formed obliquely at a predetermined angle perpendicular to the longitudinal direction of the heat sink 150. In this case, when the lighting module 100 is received in the frame 200, the interval between the lighting modules 100 functions as a flow path of rainwater flowing along the base 154.

A coupling recess 158 may be formed on sides of both ends of the heat sink 150 according to the embodiment. This intends that when the at least one lighting module 100 is disposed in the frame 200, a coupling member which improves the waterproof characteristics in the coupling of the lighting modules 100 is inserted into the coupling recess 158. The coupling recess 158 may be formed to completely pass through the both sides of the heat sink 150 or may be formed to partially pass through the heat sink 150. A component formed of a material having excellent moisture-proof characteristics, such as rubber and the like may be inserted into the coupling recess 158 at the time of the coupling of the lighting modules 100. For example, the lighting modules 100 are coupled to each other by inserting the coupling member like an O-ring into the coupling recess 158. The coupling recess 158 may be formed on both sides of the lighting module 100 or may be formed on any one of both side of the lighting module 100. A coupling material is inserted into the coupling recess 158 and is pressed by the side of another lighting module 100, so that the lighting modules 100 are coupled to each other. It is desirable that the coupling recess 158 should be formed adjacent to both ends of the heat sink 150 in the longitudinal direction of the heat sink 150 for the purpose of the reliability of the coupling of the lighting modules 100. However, the coupling recess 158 may be formed in another position of the heat sink 150. Components which are necessarily waterproofed, for example, wiring lines for driving the light emitting device module 120 may be formed around the coupling recess 158. Thanks to a process of coupling of the lighting modules 100 by inserting the material having excellent waterproof characteristics such as rubber and the like into the coupling recess 158, the components can be protected from moisture.

The light emitting device module 120 is received in the cover 110. The waterproof body 130 and the substrate 140 are sequentially formed on the light emitting device module 120, and then the heat sink 150 is formed. Thus, the lighting module 100 may be completed. In the lighting module 100, the opening portions 112, 132, 142 and 152 of the cover 110, the waterproof body 130, the substrate 140 and the heat sink 150 are disposed to be aligned with each other, so that a space is formed within the lighting module 100. The space functions as an air flow path when the lighting apparatus according to the embodiment is provided outdoors. Accordingly, the heat radiating characteristic of the entire lighting apparatus can be improved.

The lighting module 100 may be coupled to the frame 200 by a fastening member 400 passing through both ends of the heat sink 150 and a predetermined point of the frame 200. The fastening member 400 may have a screw shape passing through a predetermined point of the frame 200 by rotating and inserting or may have a nail shape passing through a predetermined point of the frame 200 by being forcibly inserted by an external force. The fastening member 400 may be adhered and fixed by passing through a predetermined point of the frame 200.

When the lighting module 100 is received in the frame 200, the lighting modules 100 may be, as described above, coupled to each other by the coupling member (not shown) inserted into the coupling member. The coupling member may be formed of a material having excellent waterproof characteristics, such as rubber and the like. For example, the O-ring may function as the coupling member. Since the coupling member is elastic, the coupling of the lighting modules 100 becomes loose with the elapse of time, so that the intervals between the lighting modules 100 may be irregular or increased. Therefore, the lighting apparatus according to the embodiment includes a pressing portion 210 at the end of the frame 200. The pressing portion 210 includes an insertion portion 212 and a pressing member 214. The insertion portion 212 extends from the frame 200 and includes an insertion hole formed therein. The pressing member 214 passes through the insertion hole of the insertion portion 212. The pressing member 214 may be formed of a component which is fixed passing through the insertion hole. According to the embodiment, the pressing member 214 may have a screw shape which passes through the insertion portion 212 by rotating and inserting or may have a nail shape which passes through the insertion portion 212. When the pressing member 214 has the nail shape, the insertion portion 212 is not formed before the pressing member 214 is inserted into the insertion portion 212, but is formed simultaneously when the pressing member 214 is inserted into the pressing portion 210 by an external force. The pressing member 214 may be also adhered and fixed to the insertion portion 212. A packing portion may be further formed inside the insertion portion 212 in order to more securely fix the pressing member 214. The packing portion may be formed of a material such as rubber or leather and the like.

When one or more lighting modules 100 are arranged in a certain direction with respect to the frame 200, a plurality of the pressing portions 210 may be formed on the side of the frame 200, which is parallel with the longitudinal direction of the lighting module 100. Accordingly, the pressing member 214 passing through the insertion hole of the insertion portion

212 may be formed in a direction perpendicular to the longitudinal direction of the lighting module 100, that is, in parallel with the direction in which the coupling recess 158 of the heat sink 150 is formed. The pressing member 214 presses the side of the lighting module 100 which is the closest to the pressing portion 210. Specifically, the pressing member 214 presses the side of the heat sink 150 of the lighting module 100 and causes the lighting modules 100 to be more securely coupled to each other by the coupling member like the O-ring. As a result, the moisture-proof characteristics of the entire lighting apparatus can be improved.

While the drawings show that the pressing portion 210 is formed only on one side of the sides of the frame 200, the pressing portion 210 may be also formed on the opposite side as well.

In the lighting apparatus according to the embodiment, since one or more lighting modules 100 are coupled to each other by the O-ring and the lighting modules 100 are more securely coupled to each other by the pressing portion 210, the lighting apparatus has excellent moisture-proof characteristics and can be used outdoors.

Meanwhile, one or more lighting modules 100 may be formed separately from each other at a predetermined interval in parallel with each other. The interval between the lighting modules is able to perform the same function as that of the space formed in the lighting module 100, that is, the space formed by aligning the opening portions 112, 132, 142 and 152 of the cover 110, the waterproof body 130, the substrate 140 and the heat sink 150.

The lighting apparatus according to the embodiment may be used outdoors. For example, when the lighting apparatus is used as a street lamp, an air flow path is formed by a space formed in the lighting module 100 and a predetermined space formed between the lighting modules 100. Accordingly, the heat radiating characteristic of the entire lighting apparatus can be improved.

Besides, since the spaces are able to function as a flow path of rainwater, the lighting apparatus may have excellent waterproof characteristics and a heat radiating characteristic improved due to the flow of the rainwater.

Second Embodiment

Figure 4A:
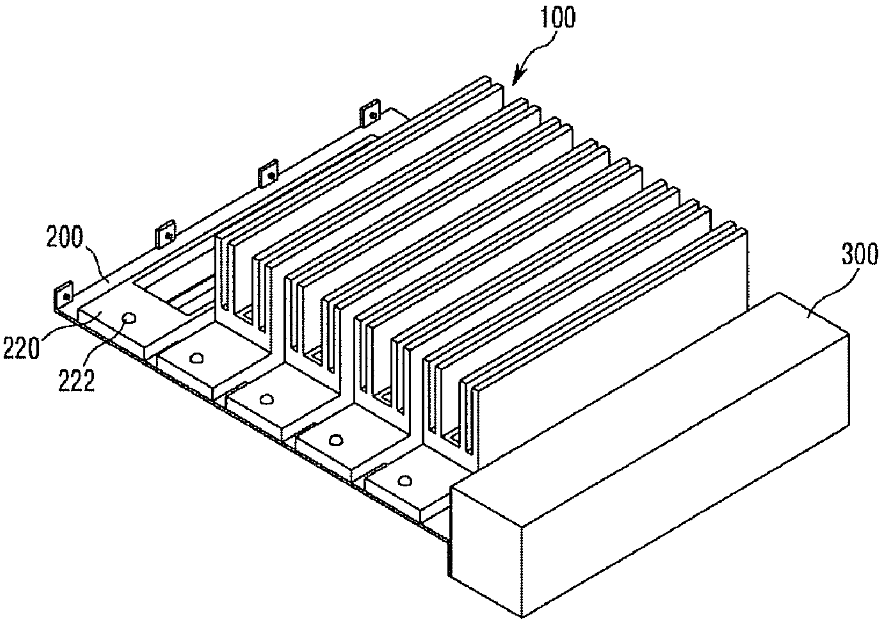
FIG. 4*a* is a plan perspective view showing a configuration of a lighting apparatus according to a second embodiment.
Figure 4B:
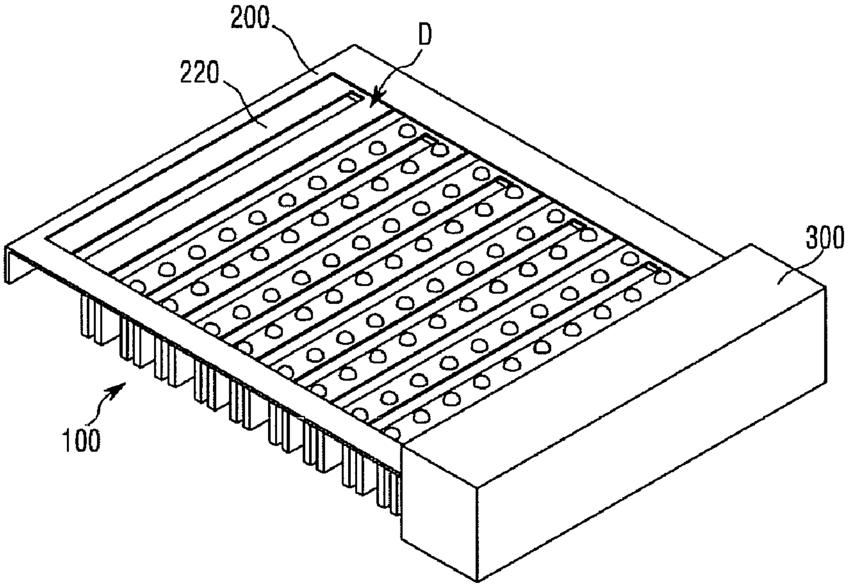
FIG. 4*b* is a bottom perspective view showing a configuration of the lighting apparatus according to the second embodiment.

FIG. 4*a* is a plan perspective view showing a configuration of a lighting apparatus according to a second embodiment. FIG. 4*b* is a bottom perspective view showing a configuration of the lighting apparatus according to the second embodiment.

The necessary maximum power output of the lighting apparatus may be changed according to a place or environment in which the lighting apparatus is installed. For example, when the electric capacity of one lighting module 100 is 20 W, the required electric power of the entire lighting apparatus may be 40 W, 60 W or 80 W and the like.

In the second embodiment, a dummy area "D" is formed in the frame 200 in order to cope with electric power requirements which are changed depending on situations. In other words, when the maximum number of the lighting modules 100 arranged in the frame 200 is "n", the smaller number than "n" of the lighting modules 100 are arranged if necessary, and the rest of the area of the frame 200 may be filled with the dummy area "D". The dummy area "D" does not include the lighting module 100 and only fills the space of the frame. The dummy area "D" may be formed as an empty space. Otherwise, as shown in FIGS. 4*a* and 4*b*, a sub-frame 220 having a shape corresponding to that of the cover 110 of the lighting module 100 may be arranged instead of the lighting module 100. Also, though not shown in the drawings, a heat sink may be further disposed on or under the sub-frame 220 so as to radiate heat generated from the light emitting device module 120 of the lighting module 100. The heat sink may be formed to have the same shape as that of the heat sink 150 of the lighting module 100. The sub-frame 220 may be formed to have exactly the same shape as that of the cover 110 or may be formed to have the shape of the cover 110 without the opening 111. Further, both ends of the sub-frame 220 may include a fastening recess 222 allowing the sub-frame 220 to couple to the frame 200. The sub-frame 220 and the frame 200 may be coupled to each other by a fastening member passing through the fastening recess 222. It is recommended that the dummy area "D" should be located as far as possible from the power supplier 300 for the sake of efficiency of electric power supply.

According to the embodiment, the frame 200 capable of receiving the number required for necessary maximum power output of the lighting modules 100 is manufactured to share the use of the frame. When power output less than the maximum power output is required, a certain area of the frame 200 is assigned as the dummy area "D", so that it is possible to implement a lighting apparatus which gives a required power output. As a result, parts of the lighting apparatus can be shared for use.

Third Embodiment

Figure 5A:
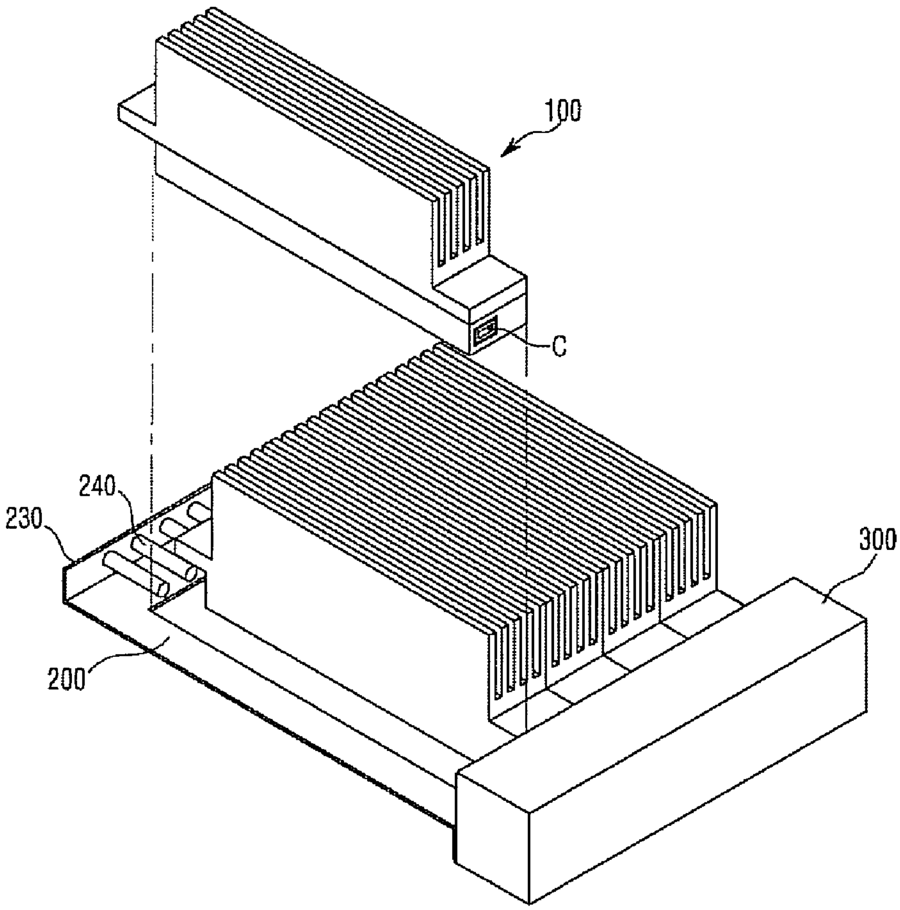
FIG. 5*a* is a plan perspective view showing a configuration of a lighting apparatus according to a third embodiment.
Figure 5B:
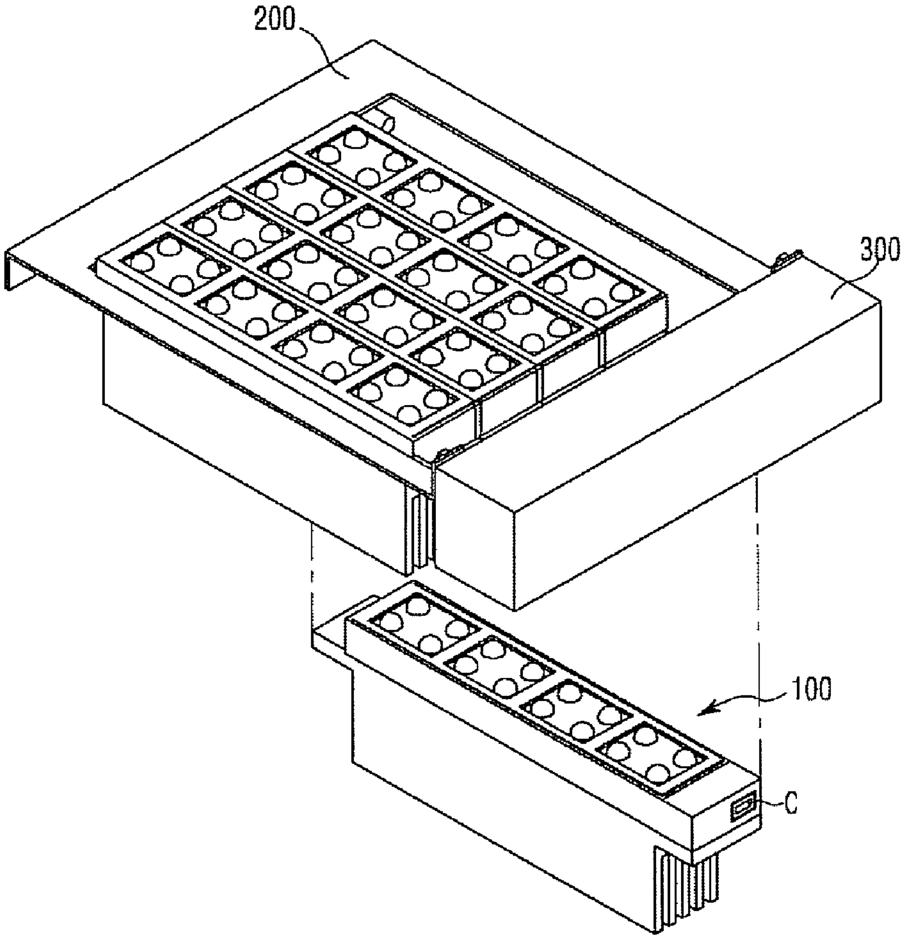
FIG. 5*b* is a bottom perspective view showing a configuration of the lighting apparatus according to the third embodiment.

FIG. 5*a* is a plan perspective view showing a configuration of a lighting apparatus according to a third embodiment. FIG. 5*b* is a bottom perspective view showing a configuration of the lighting apparatus according to the third embodiment. Descriptions of the same components as those of the first and the second embodiments will be omitted.

The cover 110 shown in FIGS. 5*a* and 5*b*, the cover 110 may be formed corresponding to the shape of the light emitting device module 120 designed to be coupled to the cover 110 and the shape of the light source included in the light emitting device module 120. For example, when the light emitting device module 120 is formed to have a square shape having light emitting devices arranged in the form of a matrix, the opening 111 may be also formed to have a square shape corresponding to that of the light emitting device module 120.

A connector "C" may be formed in one outer end of the cover 110 according to the third embodiment in order to allow the cover 110 to be electrically connected to the power supplier 300. As shown in the drawing, the connector "C" may be formed to have a depression into which the terminal of the power supplier 300 is inserted or may be formed to have another shape. The connector "C" may be formed of a conductive material for the purpose of electrical connection between the light emitting device module 120 and the substrate 140. For example, the inner wall of the depression into which the terminal of the power supplier 300 is inserted may be formed of a conductive material.

The light emitting device module 120 received in the cover 110 may include one or more light emitting devices, for example, four light emitting devices arranged in the form of a matrix.

The lighting module 100 may be formed on the frame 200. The lighting module 100 may be directly connected with the power supplier 300 by the connector "C" formed in one end of the lighting module 100. For example, the terminal of the power supplier 300 is inserted into the depression of the connector "C" formed in one outer end of the cover 110 of the lighting module 100, so that the lighting module 100 is electrically connected to the power supplier 300. Accordingly, electric power from the power supplier 300 may be directly supplied to the lighting module 100.

When the lighting module 100 is arranged in parallel with each other on the frame 200, the power supplier 300 may be disposed adjacent to one ends of all of the lighting modules 100 in order to be directly connected to all of the lighting modules 100. Accordingly, all of the lighting modules 100 arranged on the frame 200 can be directly connected to the power supplier 300 without separate component such as a cable and the like.

The lighting module 100 may be coupled to the frame 200 in a pressing manner. That is, the lighting module 100 can be fixed by pressing one end of the lighting module 100, which is not connected to the power supplier 300 among both ends of the lighting module 100. Specifically, an insertion portion 230 is formed on one edge of the frame 200, that is to say, one side of the frame 200, which is adjacent to one end of the lighting module 100, which is not connected to the power supplier 300 among both ends of the lighting module 100. A pressing member 240 is connected to the insertion portion 230. The pressing member 240 presses the one end of the lighting module 100, fixing the lighting module.

The lighting module 100 is not only directly connected to the power supplier 300 but is pressed by the pressing member 240, so that both ends of the lighting module 100 are pressed. Accordingly, the lighting module 100 can be securely coupled.

Figure 5C:
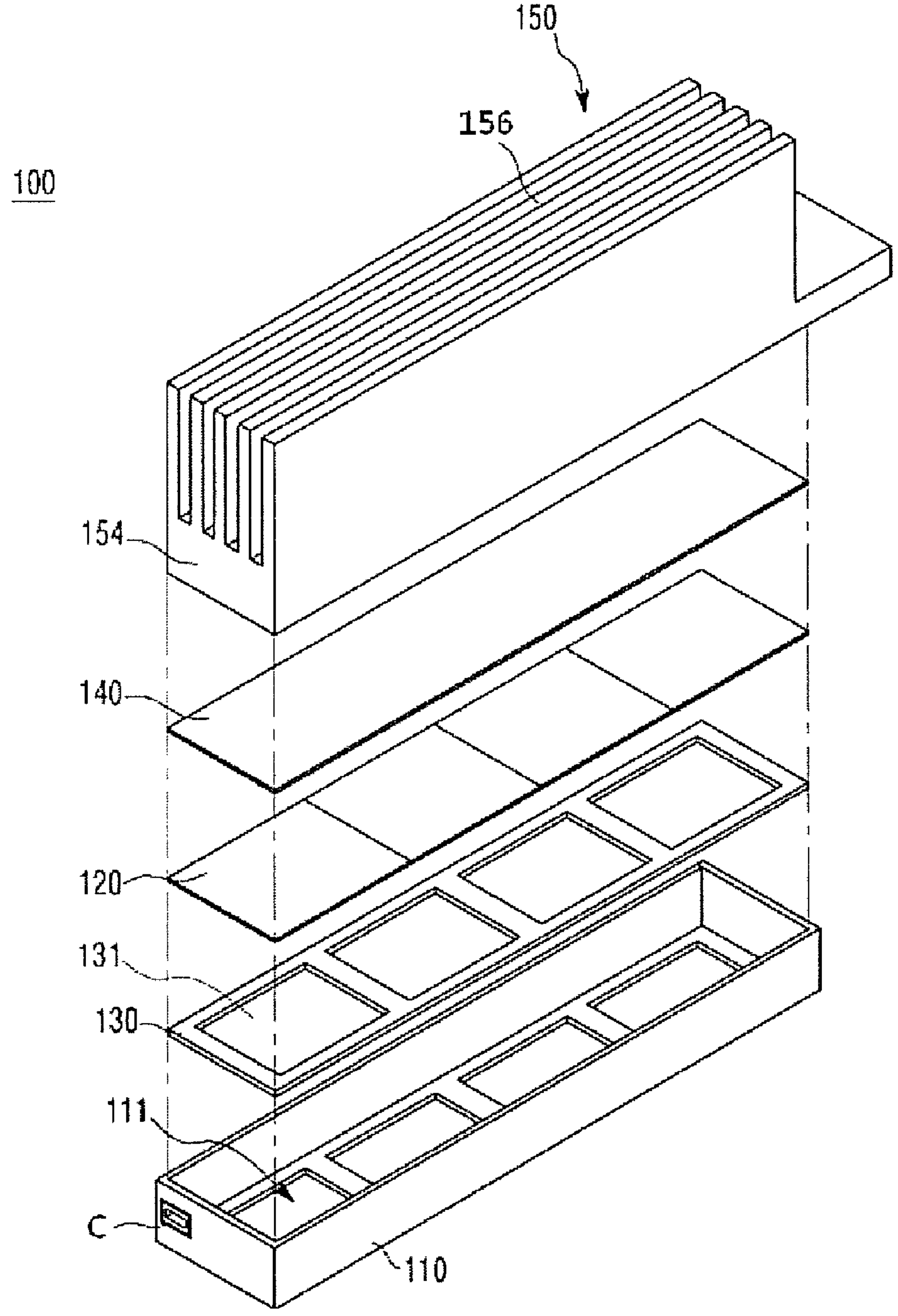
FIG. 5*c* is an exploded perspective view of a lighting module included in the lighting apparatus according to the third embodiment.

FIG. 5*c* is an exploded perspective view for describing a configuration of the lighting module 100 according to the third embodiment.

Referring to FIG. 5*c*, the lighting module 100 received in the frame 200 may include the cover 110, the light emitting device module 120, the waterproof body 130, the substrate 140 and the heat sink 150.

The cover 110 protects the light emitting device module 120. The cover 110 may include at least one opening 111 allowing a light source included in the light emitting device module 120 to be exposed outward. For example, the opening 111 may be formed corresponding to the shape of the light emitting device module 120 and the shape of the light source included in the light emitting device module 120. For example, when the light emitting device module 120 has, as shown in FIG. 5*c*, a square shape having light emitting devices arranged in the form of a matrix, the opening 111 may have a square shape corresponding to that of the light emitting device module 120.

The connector "C" may be formed in one outer end of the cover 110 in order to allow the cover 110 to be electrically connected to the power supplier 300.

The waterproof body 130 may be disposed between the light emitting device module 120 and the cover 110. The waterproof body 130 may include an opening 131 formed at a position corresponding to that of the opening 111 of the cover 110. The waterproof body 130 may be formed of an insulation material such as rubber and the like for the sake of waterproof characteristics and the like.

The light emitting device module 120 may include a plurality of the light emitting devices (for example, more than four) which are arranged in the form of a matrix. The light emitting device included in the light emitting device module 120 may be exposed outward through the opening 111 and emit light.

Wiring lines for driving the light emitting device of the light emitting device module 120 may be formed on the substrate 140. The wiring lines formed in the substrate 140 may be electrically connected to the connector "C" of the cover 110.

The cover 110 is capable of receiving an insulation layer 130, the light emitting device module 120 and the substrate 140. The heat sink 150 may be formed on the cover 110.

The heat sink 150 functions to radiate heat generated from the entire lighting module 100 by the operation of the light emitting device module 120. As shown in FIG. 5*c*, the heat sink 150 may be formed to include at least one partition wall 156 on the base 154. The one or more partition walls 156 are formed in parallel at a regular interval in the longitudinal direction of the heat sink 150.

Although embodiments of the present invention were described above, theses are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

What is claimed is:

1. A lighting module comprising:

a light emitting device module including at least one light emitting diode;

a heat sink to radiate heat generated from the light emitting device module, and the heat sink including at least one partition wall formed on a base and a first opening portion is formed at a predetermined area of the base;

a substrate disposed between the light emitting device module and the heat sink; and a cover in which the light emitting device module is provided, wherein at least two of the heat sink, the substrate and the cover include a second opening portion corresponding to the first opening portion.

2. The lighting module of claim 1, wherein at least one inclined surface at a predetermined angle is formed on at least a portion of a top surface of the base.

3. The lighting module of claim 2, wherein the at least one inclined surface is inclined toward the first opening portion.

4. The lighting module of claim 1, further comprising a waterproof body disposed between the light emitting device module and the substrate, wherein the waterproof body includes a third opening portion corresponding to the first opening portion.

5. The lighting module of claim 1, wherein the at least one partition wall is formed in a first direction parallel with a longitudinal direction of the base or in a second direction perpendicular to the first direction.

6. The lighting module of claim 1, wherein the cover includes a connector formed in one side of the cover, and the connector is connected to a power supplier for driving the light emitting device module.

7. The lighting module of claim 6, wherein the connector comprises a depression allowing a terminal of the power supplier to be directly inserted into the connector.

8. The lighting module of claim 1, wherein the partition wall is constituted by a plurality of poles having a polygonal cross section.

9. The lighting module of claim 1, wherein the cover includes a first opening exposing a light emitting device disposed on one side of the light emitting device module.

10. The lighting module of claim 9, further comprising a waterproof body being disposed between the cover and the light emitting device module, and the waterproof body including a second opening corresponding to the first opening of the cover.

11. The lighting module of claim 1, wherein the substrate being disposed on the other side of the light emitting device module and including wiring lines for driving the light emitting diode.

12. A lighting apparatus comprising:

one or more lighting modules including a light emitting device module having at least one light emitting diode and a heat sink to radiate heat generated from the light emitting device module, and the heat sink includes at least one partition wall formed on a base;

a frame in which the one or more lighting modules are disposed adjacent to each other; and a pressing portion at one side of the frame, the pressing portion to support one side of a lighting module disposed closest to the one side of the frame from among the one or more lighting modules.

13. The lighting apparatus of claim 12, further comprising a coupling member supporting between the lighting modules.

14. The lighting apparatus of claim 13, wherein one side of the heat sink comprises a coupling recess into which the coupling member is inserted.

15. The lighting apparatus of claim 12, wherein the one or more lighting modules are disposed in some areas of the frame, and wherein a dummy area including no lighting module is formed in a remainder of the area of the frame.

16. The lighting apparatus of claim 15, wherein a subframe covering at least a portion of the remainder of the area of the frame is disposed in the dummy area.

17. The lighting apparatus of claim 16, wherein the subframe having a shape corresponding to a shape of a cover accommodating a light emitting device module of the lighting module.

18. The lighting apparatus of claim 15, wherein the one or more lighting modules are sequentially arranged in a farther direction from the power supplier, and wherein the dummy area is disposed as far as possible from the power supplier.

19. A lighting module comprising:

a light emitting device module that includes at least one light emitting diode;

a heat sink to radiate heat generated from the light emitting device module, and the heat sink including at least one partition wall formed on a base; and a substrate disposed on one side of the light emitting device module, and the substrate including wiring lines for driving the light emitting diode.

20. The lighting module of claim 19, wherein at least one inclined surface at a predetermined angle is formed on at least a portion of a top surface of the base.

* * * * *